US008873692B2

(12) United States Patent
Obermeyer

(10) Patent No.: US 8,873,692 B2
(45) Date of Patent: *Oct. 28, 2014

(54) CONFIGURABLE BASEBAND IN A GPS RECEIVER

(75) Inventor: Richard Obermeyer, Tustin Ranch, CA (US)

(73) Assignee: Qualcomm Incorporated, San Diego, CA (US)

( * ) Notice: Subject to any disclaimer, the term of this patent is extended or adjusted under 35 U.S.C. 154(b) by 247 days.

This patent is subject to a terminal disclaimer.

(21) Appl. No.: 13/352,262

(22) Filed: Jan. 17, 2012

(65) Prior Publication Data

US 2012/0114018 A1    May 10, 2012

Related U.S. Application Data

(63) Continuation of application No. 11/551,113, filed on Oct. 19, 2006, now Pat. No. 8,107,579.

(60) Provisional application No. 60/728,084, filed on Oct. 19, 2005.

(51) Int. Cl.
*H03D 3/24* (2006.01)
*H03L 1/02* (2006.01)
*G01S 19/37* (2010.01)
*G01S 19/23* (2010.01)

(52) U.S. Cl.
CPC ............... *G01S 19/37* (2013.01); *H03L 1/027* (2013.01); *G01S 19/235* (2013.01); *H03L 1/028* (2013.01)
USPC ............. 375/373; 375/371; 375/354; 702/89; 702/85; 455/334

(58) Field of Classification Search
USPC .............. 375/373, 371, 354, 316; 702/89, 85; 455/334

See application file for complete search history.

(56) References Cited

U.S. PATENT DOCUMENTS

| | | | |
|---|---|---|---|
| 5,515,488 A | 5/1996 | Hoppe et al. | |
| 5,592,173 A | 1/1997 | Lau et al. | |
| 5,832,247 A | 11/1998 | Gildea et al. | |
| 6,133,871 A | 10/2000 | Krasner | |
| 7,158,904 B2 | 1/2007 | Dhamankar et al. | |
| 7,317,418 B2 * | 1/2008 | Salkhi | 342/357.62 |
| 7,546,353 B2 | 6/2009 | Hesselink et al. | |
| 8,107,579 B2 | 1/2012 | Obermeyer | |
| 2003/0003908 A1 | 1/2003 | McGrew et al. | |
| 2004/0017671 A1 | 1/2004 | Rajendran et al. | |
| 2004/0043745 A1 | 3/2004 | Najarian et al. | |
| 2004/0179247 A1 | 9/2004 | Yamaguchi et al. | |
| 2004/0236874 A1 | 11/2004 | Largman et al. | |
| 2005/0283544 A1 | 12/2005 | Yee | |
| 2008/0130717 A1 | 6/2008 | Obermeyer et al. | |

* cited by examiner

*Primary Examiner* — Phuong Phu
(74) *Attorney, Agent, or Firm* — Bay Area Technology Law Group PC

(57) ABSTRACT

Clock compensation for GPS receivers. A receiver in accordance with the present invention comprises a Radio Frequency (RF) portion, and a baseband portion, coupled to the RF portion, wherein the baseband portion comprises a crystal, an oscillator, coupled to the crystal, wherein the oscillator generates a clock signal based on a signal received from the crystal, a counter, coupled to the oscillator via the clock signal, a comparator, coupled to the counter, a controller, at least one logic gate, coupled to the comparator and the controller, and a combiner, coupled to the at least one logic gate, the controller, and the counter and producing an accurate clock signal therefrom.

11 Claims, 6 Drawing Sheets

CONFIGURABLE BASEBAND IN A GPS RECEIVER

CROSS-REFERENCE TO RELATED APPLICATIONS

This application claims the benefit under 35 U.S.C. Section 119(e) of commonly-assigned U.S. provisional patent application, Ser. No. 60/728,084, filed Oct. 19, 2005, entitled "SINGLE CHIP GPS RECEIVER," by Victor Dinh et al., which application is incorporated by reference herein, and is a continuation of U.S. Ser. No. 11/551,113, now U.S. Pat. No. 8,107,579 and of U.S. Ser. No. 11/941,369, now U.S. Pat. No. 8,548,109.

BACKGROUND OF THE INVENTION

1. Field of the Invention

The present invention relates generally to Global Positioning System (GPS) receivers, and in particular, to a GPS receiver with improved power management and relaxed part specifications.

2. Description of the Related Art

The use of GPS in consumer products has become commonplace. Hand-held devices used for mountaineering, automobile navigation systems, and GPS for use with cellular telephones are just a few examples of consumer products using GPS technology.

As GPS technology is being combined with these devices, the GPS chips are being placed in widely ranging applications. Initially, GPS chips were designed for surveying applications, and, as such, the chip and system design was engineered to provide highly accurate positioning measurements and data, without regard to power consumption, semiconductor chip footprint, or other conditions. The GPS chip design was optimized to deliver position data, rather than optimized for each application the chip is being placed into. Further, some of the GPS portions are being made on the same semiconductor chip as other portions of the combined devices, which subjects the GPS portions of these electronic devices to widely-varying semiconductor processing steps.

Since the GPS chips are now being placed into devices that are far afield from the initial intended use for GPS, it can be seen, then, that there is a need in the art to alter the design of the GPS hardware to match the requirements of the intended end-user device and environment.

SUMMARY OF THE INVENTION

To minimize the limitations in the prior art, and to minimize other limitations that will become apparent upon reading and understanding the present specification, the present invention discloses a GPS receiver. A receiver in accordance with the present invention comprises a Radio Frequency (RF) portion, and a baseband portion, coupled to the RF portion, wherein the baseband portion comprises a crystal, an oscillator, coupled to the crystal, wherein the oscillator generates a clock signal based on a signal received from the crystal, a counter, coupled to the oscillator via the clock signal, a comparator, coupled to the counter, a controller, at least one logic gate, coupled to the comparator and the controller, and a combiner, coupled to the at least one logic gate, the controller, and the counter and producing an accurate clock signal therefrom.

Such a GPS receiver further optionally includes the controller correcting or calibrating the clock signal, the controller being calibrated remotely, and the signal generated by the crystal being not accurate enough to accurately perform a geoposition calculation.

Another GPS receiver in accordance with the present invention comprises a Radio Frequency (RF) portion, and a baseband portion, coupled to the RF portion, wherein the baseband portion comprises a crystal, an oscillator, coupled to the crystal, wherein the oscillator generates a clock signal based on a signal received from the crystal, a synchronization circuit, coupled to the oscillator via the clock signal, a counter, coupled to the synchronization circuit and receiving a high-speed clock signal, and generating a value therefrom, and a controller, coupled to the counter, wherein the high-speed clock signal calibrates the clock signal.

Such a GPS receiver further optionally comprises the RF portion and the baseband portion being on a single semiconductor chip, the high-speed clock signal being generated by a Temperature Controlled Crystal Oscillator (TCXO), the clock signal being synchronized to the high-speed clock signal, the controller adjusting the value to correct the clock signal, the controller adjusting the value based on a temperature value, and the controller being updated remotely.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

The present invention is a GPS chip that is optimized in specific areas for power and space optimization.

Figure 1:
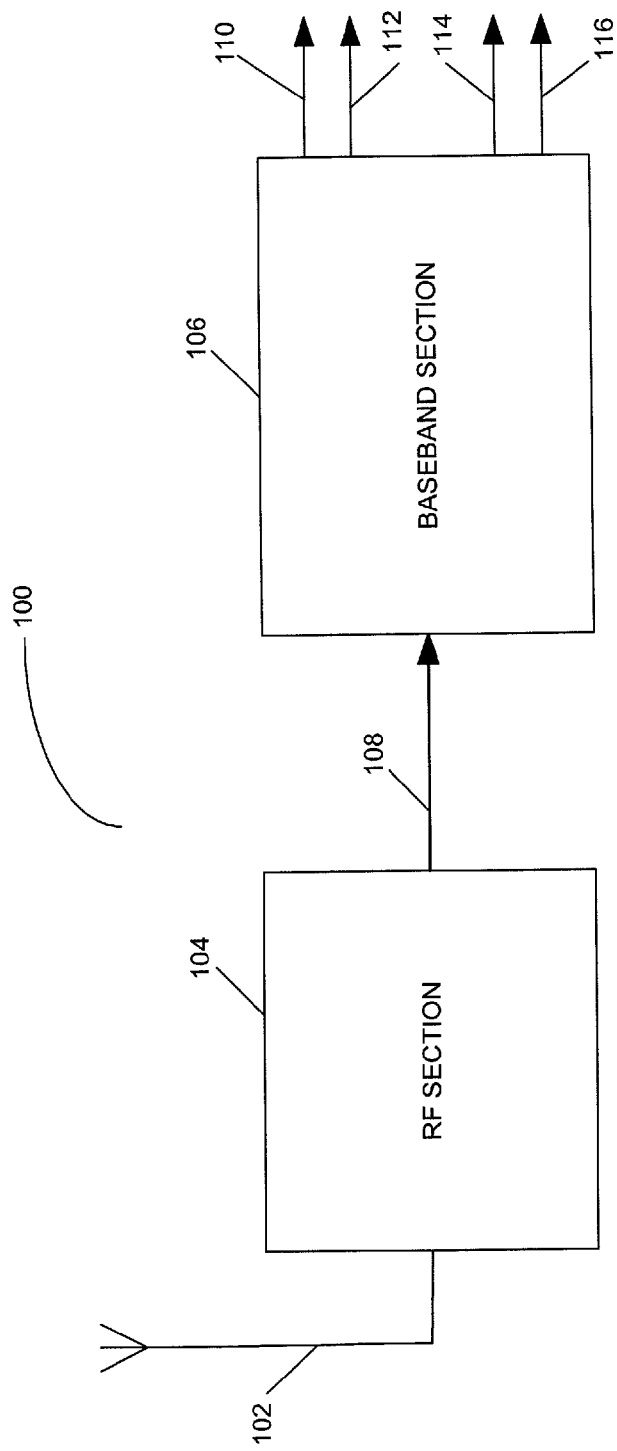
FIG. 1 illustrates a top-level block diagram of a GPS receiver.

FIG. 1 illustrates a top-level block diagram of a GPS receiver.

Receiver 100 typically comprises an antenna 102, a Radio Frequency (RF) section 104, and a baseband section 106. Typically, antenna 102 receives signals that have been transmitted by a GPS satellite, that are then amplified and downconverted in the RF section 104. RF section 104 then sends signals 108 to baseband section 106 for processing and position determination. Signals 108 typically include an oscillator signal, an in-phase signal, a quadrature-phase signal, an Automatic Gain Control (AGC) signal, and other signals.

Baseband section 106 generates multiple outputs 110-116, e.g., Doppler, pre-processed Intermediate Frequency (IF) data, integrated phase, pseudorange, time, velocity, position, etc.

Figure 2:
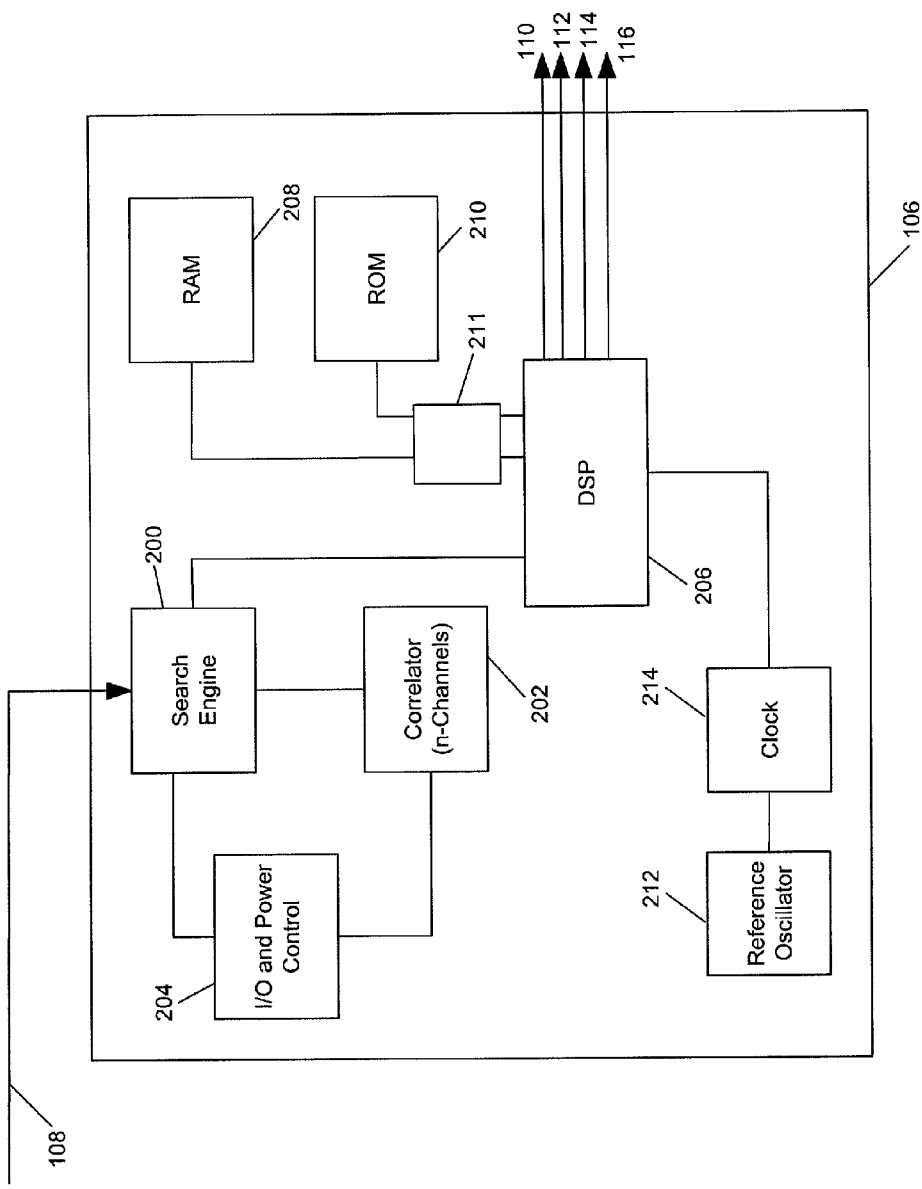
FIG. 2 illustrates a diagram of the baseband section of a GPS receiver.

FIG. 2 illustrates a diagram of the baseband section of a GPS receiver. Baseband section 106 receives signals 108 from the RF section 104, and uses search engine 200 and correlator 202 to process the signals 108 to obtain useful data. Input/Output (I/O) control 204 is coupled to search engine 200 and correlator 202 to manage the power and data flow for search engine 200 and correlator 202.

DSP 206 accesses RAM 208 and ROM 210 via memory controller 211 for various programming steps that are used to process the data discovered by search engine 200 and correlator 202. DSP then generates the output signals 110-116.

Because a typical GPS receiver 100 must be able to navigate (track satellites for a given amount of time) and generate position for a given period of time, e.g., for a minute or two, the receiver 100 must utilize a significant amount of RAM 208 and ROM 210. For example, a typical GPS receiver 100 baseband section 106 requires about 64 k of RAM 208, and about 1 k of ROM 210.

To properly synchronize the signals, etc. that are being processed, the DSP 206 (and, possibly, the correlators 202, search engine 200, etc), are connected to a reference oscillator 212 and/or clock 214. The reference oscillator 212 is typically a crystal, a Temperature Controlled Crystal Oscillator (TCXO), or other stable oscillating source, which is then either upconverted or downconverted by the clock 214 to generate frequencies of interest. These oscillators can also be used with the RF section 104 if desired.

Optimized Portions of the GPS Receiver

Clock Compensator

Figure 3:
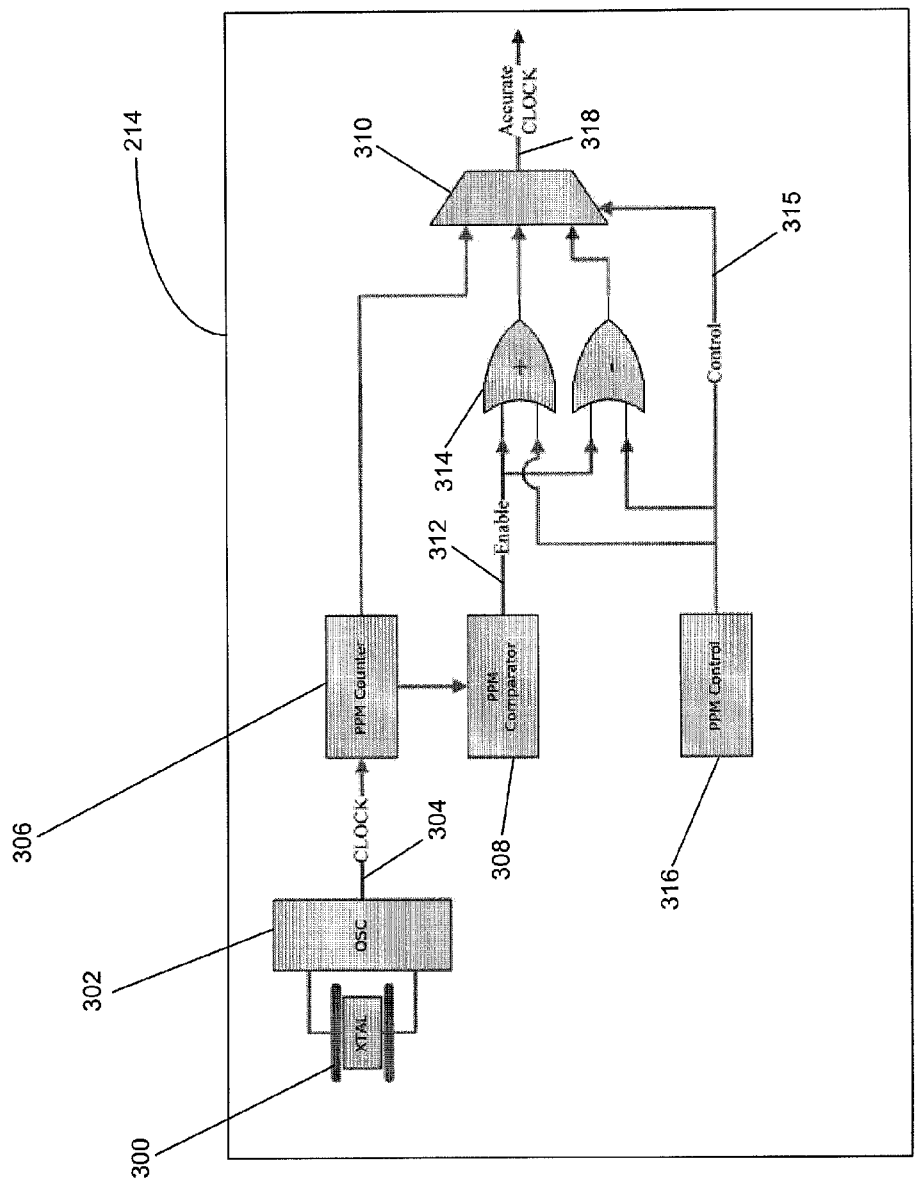
FIG. 3 illustrates a clock compensator in accordance with the present invention.

FIG. 3 illustrates a clock compensator in accordance with the present invention.

Clock 214 is shown, where crystal 300 is coupled to oscillator 302 to generate clock signal 304. Clock signal 304 is then put into a counter 306, which outputs a counter signal to a comparator 308 and a combiner 310. Comparator 308 outputs enable signal 312 to logic gates 314, which also receive control signals 315 from a controller 316. Logic gates 314 and controller 316 are also used as inputs to combiner 310, which outputs an accurate clock signal 318 for use in chip 106.

The controller 316 and comparator 308 provide a correction and compensation schema for crystal 300 and oscillator 302. When crystal 300 is a highly accurate crystal at the beginning of life stage and at a specific temperature, controller 316 and comparator 308 are not needed. However, highly accurate crystals 300 that remain stable over a long period of time and over temperature differences are quite expensive, and even these crystals 300 have aging and temperature problems that affect their accuracy. The controller 316 and comparator 308, along with combiner 310, allow for cheaper crystals 300 to be used in applications where high precision is required, such as GPS receivers, which reduces the cost of such devices. Further, the schema of FIG. 3 can be upgraded in the field or remotely, or via remote programming sent via wireless transmission, because controller 316 can be reprogrammed to compensate crystal 300 in different ways based on temperature, age, or other factors that affect the frequency output of crystal 300. As such, less expensive parts can be used, and these less expensive parts can be maintained at a higher accuracy for a longer period of time, using the schema of the present invention.

Clock pulses are added or deleted when the counter 306 reaches a certain number, which number is stored in the comparator 308, and controlled by the controller 316. The control signal 315 is used to turn on or off the logic gates 314, as well as gate the output of combiner 310. Typically, without the correction and calibration provided by comparator 308, controller 316, and logic gates 314, crystal 300 would not be accurate enough to perform a geoposition calculation for a GPS receiver 100. However, because comparator 308 and controller 316 provide increased accuracy for crystal 100, the schema in FIG. 3 allows for a crystal 300 that would otherwise not be useful in a GPS receiver 100 to be used to perform geoposition calculations.

Clock Calibration Using High Speed Clock

Figure 4:
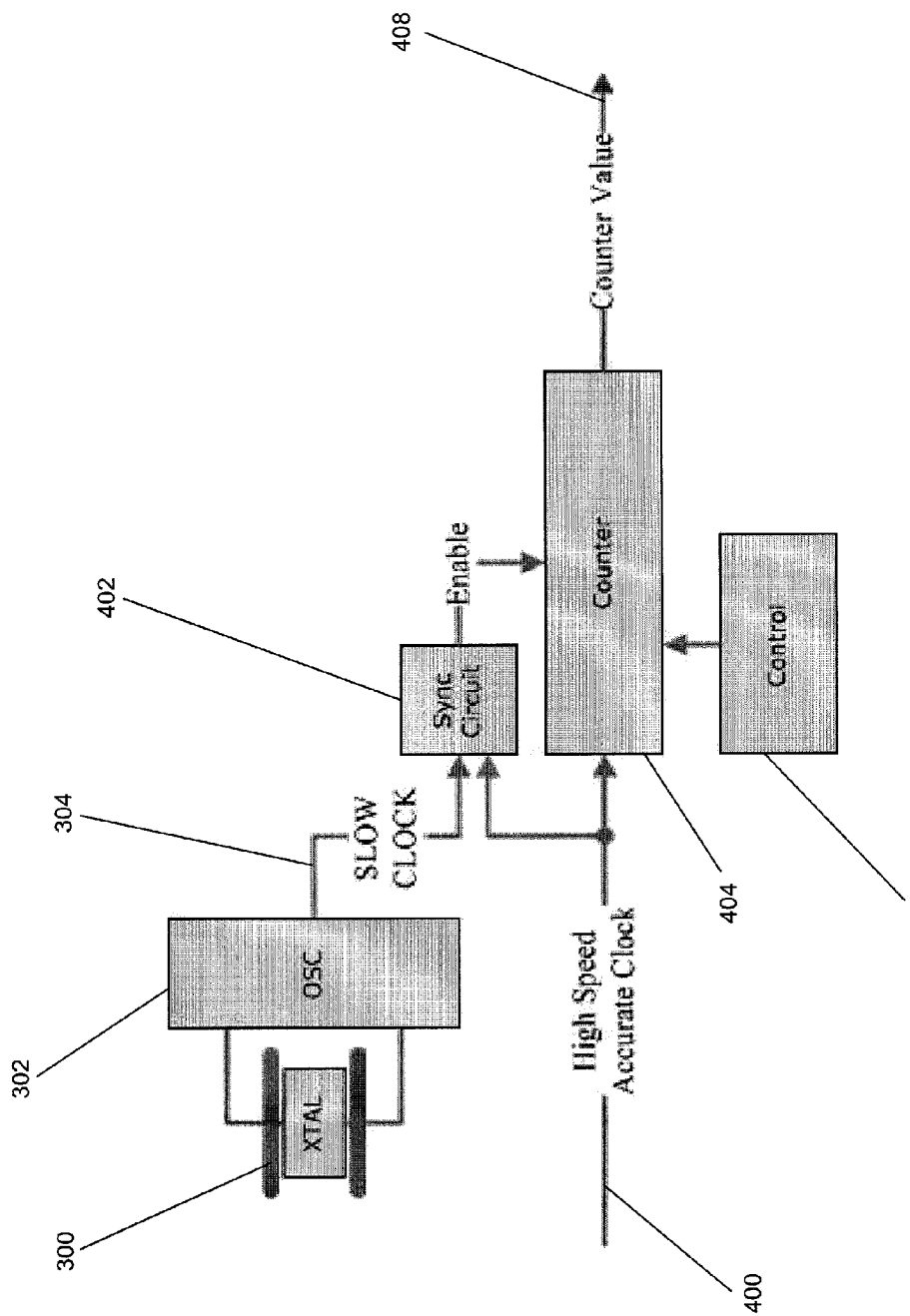
FIG. 4 illustrates a calibration schema in accordance with the present invention.

FIG. 4 illustrates a calibration schema in accordance with the present invention.

Many clock signals exist within chip 100, some of which are high-speed clock signals used within the RF section 104.

As in FIG. 3, crystal 300 and oscillator 302 are shown, which generate clock signal 304. However, a high speed clock signal 400 is used as an input to a synchronizing circuit 402, which then synchronizes the high speed clock signal 400 and the clock signal 304. The high speed clock signal 400 is also used as an input to the counter 404, which is controlled by controller 406. The output of the counter 408 is then used as a clock signal which is at the same frequency as the slow clock signal 304, however, this signal is much more accurate and stable than the slow clock signal 304 because it has been stabilized by the high speed clock signal 400.

GPS receivers 100 require a highly accurate clock signal, usually generated by a Temperature Controlled Crystal Oscillator (TCXO). TCXO components are very expensive to purchase, and still suffer from degradation over time. However, as shown in FIG. 4 of the present invention, other clock signals already present on the receiver 100, such as high speed clock signal 400, can be used to stabilize and calibrate low speed clock signal 304 without resorting to a TCXO; crystal 300 can be a less expensive, less accurate crystal which costs less and the output 408 can still be an accurate clock signal.

Slow clock signal 304 is synchronized to high speed clock signal 400 via synch circuit 402, which generates an enable signal input to counter 404. This enable signal sets the period for the counter value, and is the period of the slow clock signal 304. The high speed clock signal is used to count during the period that the enable signal is on. The number of clock cycles counted during the enable period is the difference in frequency between clock 304 and clock 400. The controller 406 can then read this counter value at the end of a given period, or any multiple of these periods, and use the average value or given value to slow down or speed up the clock signal 304. Other inputs can be used as part of the controller 406 inputs to counter 404, e.g., temperature compensation for crystal 300, which will allow for a more accurate clock 304 signal and therefore a more accurate output 408. Further, controller 406 can be updated either manually or via remote periodic updates to include different compensation schema for crystal 300. High speed clock signal 400 can also be changed via a switch or other means to allow multiple inputs or a selection of inputs to counter 404, which may provide additional precision in the control of clock 304.

Dynamic Memory Management

Figure 5:
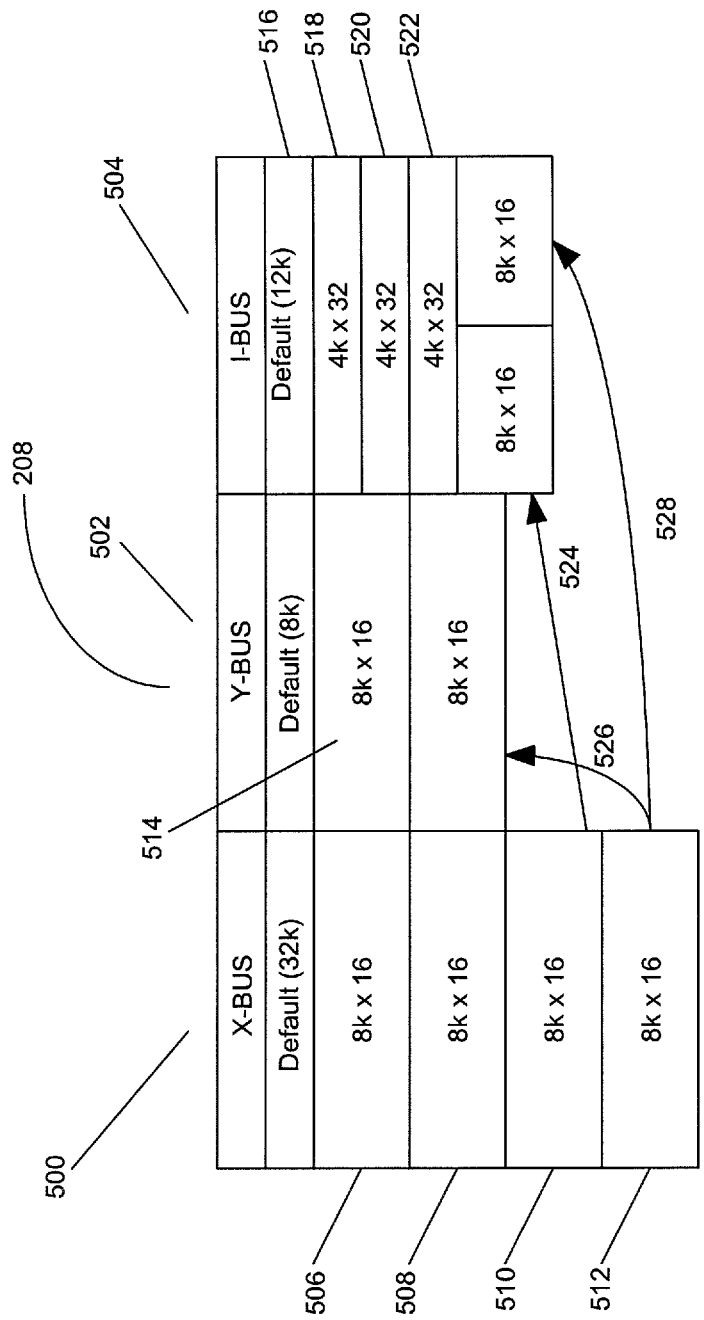
FIG. 5 illustrates a memory block map in accordance with the present invention.

FIG. 5 illustrates a memory block map in accordance with the present invention.

Within memory 208 and 210, various portions of memories 208 and 210 are used or allocated for various purposes. Some of the memory 208 and 210 is used to store data; other portions of memories 208 and 210 are used for instructions that are sent to DSP 206. The problem, however, is that for many applications, the memory must be sized prior to the software being written, and thus, the memory must be larger than actually needed because the software may need more room for storage.

The present invention allows for dynamic allocation of sizes for data and instruction storage within memories 208 and 210 without using any control bits to allocate these memory 208 and 210 sizes. Memory 208, for example, may be allocated during a software build as follows: out of a 64 kilobyte memory 208 size, 12 kilobytes for instruction and 52 kilobytes for data. For a second application that is using memory 208, the second application can allocate 20 kilobytes for instruction and 44 kilobytes for data.

This dynamic allocation of memory blocks needed within memory 208 and 210 allows for more flexibility during software builds, as well as reducing the size, cost, and power draw from memory 208 and memory 210. Further, a wider range of applications can be supported when the memory 208 and 210 are dynamically changeable without additional control bits from DSP 206.

FIG. 5 shows a possible allocation of the memory 208 based on data, instruction, and other data in accordance with the present invention.

For example, memory 208 is allocated by DSP 206 into specific memory buses, namely X-bus 500, Y-bus 502, and I (instruction) bus 504. X-bus 500 and Y-bus 504 are 16 bits wide, while I-bus 504 is 32 bits wide. Typically, X-bus 500, Y-bus 502, and I bus 504 have default values of how large each memory bus is within memory 208. For example, and not by way of limitation, X-bus 500 can have a default of 32 kilobytes, Y-bus 502 can have a default of 8 kilobytes, and I bus 504 can have a default of 12 kilobytes.

However, memory 208 often needs to re-allocate the memory allocated to the X-bus 500, Y-bus 502, and I-bus 504 to allow applications to run, additional data to be stored, etc. The present invention allows for this by breaking up the various buses into blocks and then allowing memory controller 211 to dynamically allocate the memory blocks as needed.

So, for example, X-bus 500 is broken into blocks 506-512. Blocks 506 and 508 cannot be allocated to any other memory bus; however, blocks 510 and 512 can be allocated to either Y-bus 502 or I bus 504 as needed. Similarly, Y-bus 502 has a single block 514, but can have block 512 allocated to the Y-bus 502 by memory controller 211 as needed or commanded by DSP 206. Further, I-bus 504 has memory blocks 516-522, but, if more memory is needed by I-bus 504, memory controller 211 or DSP 206 can allocate memory block 510 and/or memory block 512 as needed. Memory controller 211 allocates and deploys memory blocks 510 and 512 as needed, which is shown by arrows 524-528.

Programmable I/O Drive Strength

Figure 6:
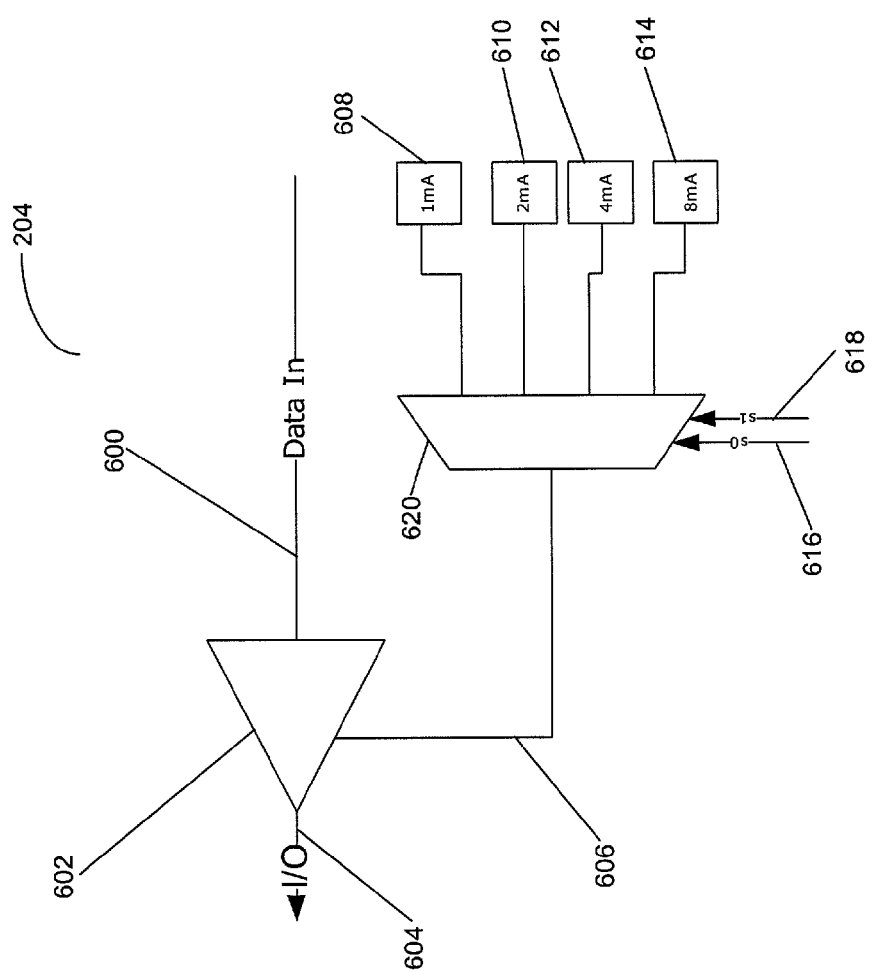
FIG. 6 illustrates a programmable drive current in accordance with the present invention.

FIG. 6 illustrates a programmable drive current in accordance with the present invention.

Within I/O controller 204, data input 600 is fed to buffer 602 to produce output 604. Drive signal 606 is input to buffer 602 to produce the proper drive for input 600, to allow the output 604 to drive the corresponding circuitry within I/O controller 204 or elsewhere within baseband section 106.

However, different applications need different drive strengths for the same input 600. For example, when chip 100 is under test, a stronger drive current is needed to make sure that chip 100 is working properly, and in low-power conditions, a lower-power drive strength (by reducing the drive current) is needed to conserve power draw within chip 100.

As such, the present invention uses various drive current generators 608-614, and control signals 616-618, as inputs to selector 620 to control the drive current to buffer 602. So, for example, and not by way of limitation, when Automatic Test Equipment is being used to test the chip 100, a higher drive current, say an 8 milliamp driver 614, can be used to test the functionality of the chip 100. This may never be used in actual operation, and, as such, is not needed during normal operation and driver 614 can be disabled or otherwise turned off so as not to draw power during operation of chip 100.

However, chip 100 can also use lower power drivers, such as 1 milliamp driver 608, for certain applications such as a low power mode or a non-tracking mode for the GPS receiver chip 100. Flash startup mode may require a 4 milliamp driver 612, and normal operation may require a 2 milliamp driver 610.

The drivers 608-614 can be selected through the use of control lines 616-618, which can be digital control signals. For example, and not by way of limitation, when both control lines 616 and 618 are low, driver 608 is selected, when line 616 is high and 618 is low driver 610 is selected, when line 616 is low and 618 is high driver 612 is selected, and when both lines 616 and 618 are high, driver 614 is selected.

CONCLUSION

In summary, the present invention describes a GPS receiver. A receiver in accordance with the present invention comprises a Radio Frequency (RF) portion, and a baseband portion, coupled to the RF portion, wherein the baseband portion comprises a crystal, an oscillator, coupled to the crystal, wherein the oscillator generates a clock signal based on a signal received from the crystal, a counter, coupled to the oscillator via the clock signal, a comparator, coupled to the counter, a controller, at least one logic gate, coupled to the comparator and the controller, and a combiner, coupled to the at least one logic gate, the controller, and the counter and producing an accurate clock signal therefrom.

Such a GPS receiver further optionally includes the controller correcting or calibrating the clock signal, the controller being calibrated remotely, and the signal generated by the crystal being not accurate enough to perform a geoposition calculation.

Another GPS receiver in accordance with the present invention comprises a Radio Frequency (RF) portion, and a baseband portion, coupled to the RF portion, wherein the baseband portion comprises a crystal, an oscillator, coupled to the crystal, wherein the oscillator generates a clock signal based on a signal received from the crystal, a synchronization circuit, coupled to the oscillator via the clock signal, a counter, coupled to the synchronization circuit and receiving a high-speed clock signal, and generating a value therefrom, and a controller, coupled to the counter, wherein the high-speed clock signal calibrates the clock signal.

Such a GPS receiver further optionally comprises the RF portion and the baseband portion being on a single semiconductor chip, the high-speed clock signal being generated by a Temperature Controlled Crystal Oscillator (TCXO), the clock signal being synchronized to the high-speed clock signal, the controller adjusting the value to correct the clock signal, the controller adjusting the value based on a temperature value, and the controller being updated remotely.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto and the equivalents thereof.

What is claimed is:

1. A Global Positioning System (GPS) receiver, comprising: a Radio Frequency (RF) portion; and a baseband portion, coupled to the RF portion, wherein the baseband portion comprises a crystal; an oscillator, coupled to the crystal, wherein the oscillator generates a clock signal based on a signal received from the crystal; a counter, coupled to the oscillator via the clock signal, a comparator, coupled to the counter; a controller programmed to measure a physical condition of the crystal, to calculate a compensation from the measured physical condition and to apply the compensation; at least one logic gate, coupled to the comparator and the controller; and a combiner, coupled to the at least one logic gate, the controller, and the counter and producing an accurate clock signal therefrom.

2. The GPS receiver of claim 1, wherein the controller corrects the clock signal.

3. The GPS receiver of claim 2, wherein the controller is reprogrammable.

4. The GPS receiver of claim 1, wherein the controller is calibrated using information generated by a physically separate device.

5. The GPS receiver of claim 1, wherein the signal generated by the crystal is not accurate enough to accurately perform a geoposition calculation.

6. A Global Positioning System (GPS) receiver, comprising: a Radio Frequency (RF) portion generating a high-speed clock signal; and a baseband portion, coupled to the RF portion, wherein the baseband portion comprises a crystal; an oscillator, coupled to the crystal, wherein the oscillator generates a slow-speed clock signal based on a signal received from the crystal; a synchronization circuit, coupled to the oscillator via the slow-speed clock signal, a counter, coupled to the synchronization circuit and receiving the high-speed clock signal, and generating a value therefrom; a controller, coupled to the counter, wherein the high-speed clock signal calibrates the slow-speed clock signal; and a GPS digital signal processor driven by the calibrated slow-speed clock signal.

7. The GPS receiver of claim 6, wherein the RF portion and the baseband portion are on a single semiconductor chip.

8. The GPS receiver of claim 7, wherein the high-speed clock signal is generated by a Temperature Controlled Crystal Oscillator (TCXO).

9. The GPS receiver of claim 7, wherein the slow-speed clock signal is synchronized to the high-speed clock signal.

10. The GPS receiver of claim 9, wherein the controller adjusts the value to correct the slow-speed clock signal.

11. The GPS receiver of claim 10, wherein the controller is updated using information generated by a physically separate device.

* * * * *